United States Patent
Wang et al.

(10) Patent No.: US 9,401,277 B2
(45) Date of Patent: Jul. 26, 2016

(54) SUBSTRATE PROCESSING WITH REDUCED WARPAGE AND/OR CONTROLLED STRAIN

(71) Applicant: Ultratech, Inc., San Jose, CA (US)

(72) Inventors: Yun Wang, San Jose, CA (US); Shaoyin Chen, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 197 days.

(21) Appl. No.: 13/913,045

(22) Filed: Jun. 7, 2013

(65) Prior Publication Data

US 2013/0273751 A1 Oct. 17, 2013

Related U.S. Application Data

(60) Division of application No. 13/245,778, filed on Sep. 26, 2011, now abandoned, which is a continuation of application No. 12/807,347, filed on Sep. 1, 2010, now abandoned, which is a continuation of application No. 12/152,019, filed on May 12, 2008, now abandoned.

(51) Int. Cl.
*B23K 26/00* (2014.01)
*H01L 21/263* (2006.01)
*B23K 26/08* (2014.01)
*C30B 1/06* (2006.01)
*H01L 21/02* (2006.01)

(52) U.S. Cl.
CPC .......... *H01L 21/263* (2013.01); *B23K 26/0006* (2013.01); *B23K 26/0066* (2013.01); *B23K 26/082* (2015.10); *B23K 26/0823* (2013.01); *C30B 1/06* (2013.01); *H01L 21/02532* (2013.01); *H01L 21/02675* (2013.01); *H01L 21/02691* (2013.01); *B23K 2203/56* (2015.10)

(58) Field of Classification Search
CPC ............ H01L 21/263; H01L 21/02691; H01L 21/02532; B23K 26/0066; B23K 26/0823; B23K 26/0042
See application file for complete search history.

(56) References Cited

U.S. PATENT DOCUMENTS

| | | | |
|---|---|---|---|
| 4,375,993 A * | 3/1983 | Mori et al. | 438/151 |
| 6,747,245 B2 | 6/2004 | Talwar et al. | |
| 6,865,308 B1 | 3/2005 | Conway et al. | |
| 7,238,915 B2 | 7/2007 | Grek et al. | |
| 2004/0084427 A1 * | 5/2004 | Talwar et al. | 219/121.73 |
| 2004/0173585 A1 | 9/2004 | Talwar et al. | |
| 2004/0188396 A1 | 9/2004 | Talwar et al. | |
| 2005/0067384 A1 | 3/2005 | Talwar et al. | |
| 2005/0103998 A1 | 5/2005 | Talwar et al. | |
| 2006/0255017 A1 | 11/2006 | Markle et al. | |

* cited by examiner

*Primary Examiner* — Christina Johnson
*Assistant Examiner* — Xue Liu
(74) *Attorney, Agent, or Firm* — Allston L. Jones; Peters Verny, LLP

(57) ABSTRACT

Provided are systems and methods for processing the surface of substrates that scan a laser beam at one or more selected orientation angles. The orientation angle or angles may be selected to reduce substrate warpage. When the substrates are semiconductor wafers having microelectronic devices, the orientation angles may be selected to produce controlled strain and to improve electronic performance of the devices.

18 Claims, 16 Drawing Sheets
(5 of 16 Drawing Sheet(s) Filed in Color)

SUBSTRATE PROCESSING WITH REDUCED WARPAGE AND/OR CONTROLLED STRAIN

BACKGROUND

1. Field of the Invention

The invention relates generally to systems and methods for processing the surface of substrates, e.g., semiconductor wafers. In particular, the invention relates to such systems and methods that scan a beam along selected orientation angles to reduce substrate warpage and/or control substrate stresses and strains.

2. Description of Background Art

Microelectronic circuit and other microstructural features are created on a substrate through the use of photolithographic technology. Typically, photolithography tools and processes are designed to image substrates such as unstrained semiconductor wafers having a substantially or perfectly flat wafer surface topography. While unprocessed semiconductor wafers may be initially unstrained, subsequent wafer processing may warp or otherwise uncontrollably strain the wafers.

In general, warped substrates such as semiconductor wafers are accompanied with wasted tool operation time, increased wafer process costs, and reduced overall processing efficiency. For example, the robustness of the photolithographic process generally depends at least in part on the lithographic system's ability to achieve focus when the topography of the surface to be imaged deviates from an ideal. When the warping or the degree of non-flatness of the substrate surface exceeds the range of the depth of focus (DOF) of a system, a mask pattern imaged onto the photoresist layer on the substrate by the system will be out of focus in at least some regions on the substrate. This can result in flaws in the subsequent processing and lead to defective circuits or microstructures. One primary "flaw" of concern is achieving the desired critical dimension (CD) in terms of both size and shape of the feature. In short, excessive deviation of a substrate surface from the plane of focus of the photolithographic tools and processes represents a source of aberration from desired feature dimensions and resolution.

It is undesirable to use processes accompanied with unacceptable strain or warpage problems for other reasons as well. For example, the effectiveness of photolithographic processes for semiconductor wafers depends, often in part, on the alignment of a wafer under processing (or surface and/or interior features thereof) with respect to a mask used in the optical exposure of the photolithographic process. Misalignment of a wafer under processing with respect to the mask is undesirable and can occur when wafer strain is introduced in an uncontrolled manner. When misalignment exceeds the tolerance range, a resultant circuit may be rendered defective, thereby causing poor performance or even failure of the circuit. In short, uncontrolled stresses and strains accumulated over a series of wafer layers may result in alignment problems that result in the formation of defective microelectronic components such as transistors for either negative-channel or positive-channel metal-oxide-semiconductors (NMOS and PMOS).

Coherent and incoherent laser technologies may be used to carry out thermal processing semiconductor-based microelectronic devices such as processors, memories and other integrated circuits (ICs) that require thermal processes. For example, the source/drain parts of transistors may be formed by exposing regions of a silicon wafer substrate to electrostatically accelerated dopants containing boron, phosphorous or arsenic atoms. After implantation, the interstitial dopants are electrically inactive and require activation. Activation may be achieved by heating the entirety or a portion of the substrate to a particular processing temperature for a period of time sufficient for the crystal lattice to incorporate the impurity atoms into its structure. Typically, laser technologies are used to rapidly heat the wafer to temperatures near the semiconductor melting point to incorporate dopants at substitutional lattice sites, and the wafer is rapidly cooled to "freeze" the dopants in place.

A rapid thermal cycle is used to "activate" the dopant atoms in the junction areas to avoid any appreciable change in the dopant atom distribution. As a result, an ideal box-like activated dopant profile, as substantially defined by the implant process rather than by the subsequent heating, is created. Exemplary terminology used to describe laser-based thermal processing techniques include laser thermal processing (LTP), laser thermal annealing (LTA), and laser spike annealing (LSA). In some instances, these terms can be used interchangeably.

Laser processing techniques involving lasers and/or laser diodes typically involve forming a laser beam into a long, thin image, which in turn is quickly scanned across a surface to be heated, e.g., an upper surface of a semiconductor wafer. For example, LTP may use a continuous or pulsed, high-power, $CO_2$ laser beam, which is coherent in nature. The $CO_2$ laser beam is raster scanned over the wafer surface so all regions of the surface are exposed to at least one pass of the heating beam. Similarly, a laser diode bar may be used to produce an incoherent beam for scanning over the wafer surface.

In the time that it takes for the beam to pass over a particular location on the surface of the wafer, that location is raised to an annealing temperature. For example, raster scanning a 100-μm wide beam across a wafer surface at a constant velocity of 100 mm/s may result in a 1-millisecond dwell time for the heating cycle. A typical maximum temperature during this heating cycle might be about 1350° C. for silicon wafers. Within the dwell time needed to bring the wafer surface up to the maximum temperature, a layer only about 100 to about 200 micrometers below the surface region is heated. The bulk of the millimeter thick wafer serves to cool the surface almost as quickly as it was heated once the laser beam is past. Additional information regarding laser-based processing apparatuses and methods can be found in U.S. Pat. No. 6,747,245 and U.S. Patent Application Publication Nos. 2004/0188396, 2004/0173585, 2005/0067384, and 2005/0103998 each to Talwar et al.

Wafer warpage and strains are a well-known phenomenon in the art of semiconductor wafer processing. For example, implantation processes as described above tend to create stresses in semiconductor wafers. Similarly, temperature gradients associated with wafer surface heating also tends to induce stress in wafers. As observed in U.S. Pat. No. 6,865,308 to Conway et al., silicon wafers having layers deposited and annealed thereon at relatively high temperatures tend to become warped. In extreme cases, the wafer itself becomes so warped after a particular subprocess that the wafer cannot be properly secured to stepper chucks for subsequent subprocesses.

Laser-based semiconductor wafer processes, as discussed below, may result in undesirable strains and wafer warping. For example, laser spike annealing techniques has been extensively applied in current semiconductor industry for junction annealing to achieve excellent device performance. In the context of such applications, higher annealing temperatures are generally desirable because, as illustrated in FIG. 1, higher annealing temperatures tend to give rise to improved device performance. However, it has been observed that wafers processed using scanned laser beams tend to become warped. In some instances, the wafer warpage generated during LSA process may exceed the tight tolerance required for IC manufacturing processes such as those involving photolithography. In particular, FIG. 2 shows that wafer warpage generally increases with higher LSA temperature.

Nevertheless, strain associated with semiconductor substrates such as silicon wafers does not necessarily poses a problem in all semiconductor processing contexts. For example, strain engineering has been widely used recently to boost the transistor performance in silicon wafers. In particular, it has been observed that current flow may be improved by aligning strain with certain crystallographic and/or transistor orientations.

Thus, there is a need to find solutions to mitigate wafer warpage problems that may arise as a result of improved laser processing techniques that involve increased processing temperatures. In addition, there are opportunities in the art to employ laser processing techniques to produced improved microelectronic devices by providing a means to effect wafer strain in a controlled manner.

SUMMARY OF THE INVENTION

In a first embodiment, the invention provides a system for processing a surface of a substrate. That system includes a radiation source, e.g., a $CO_2$ laser, a stage, a substrate-orienting means, and a controller. The radiation source is adapted to emit a photonic beam suitable for processing the substrate surface. The stage is adapted to support and move the substrate translationally relative to the beam. The substrate-orienting means is effective for orienting the substrate rotationally relative to the beam. The controller is operably coupled to the radiation source, the stage, and/or the substrate orienting means is adapted to provide relative scanning motion between the stage and the beam. As a result, the beam may be scanned translationally over the substrate surface along a first path at a first orientation angle followed by translational scanning over the substrate surface along a second path at a second orientation angle. Typically, the beam is scanned translationally over substantially the entire substrate surface at first and second orientation angles.

Optionally, a relay may be provided to direct the beam toward the substrate surface at an incidence angle of at least 45° or substantially identical to the Brewster's angle of the beam for the substrate surface. In some instances, the relay is adapted to form an elongate image on the substrate surface. Such an image may have a lengthwise axial directionality that traverses the relative translational scanning motion between the beam and the stage.

In some instances, the substrate-orienting means is adapted to alter the substrate from the first to the second orientation angle without removing the substrate from the stage. In the alternative, the substrate may be removed from the stage to alter the substrate from the first to the second orientation angle. In any case, the first and second orientation angles may differ by about 90°.

In another embodiment, the invention provides a method for processing a surface of a substrate. The method involves generating a photonic beam suitable for processing the substrate surface, scanning the beam translationally over the substrate surface along a first path at a first orientation angle, and scanning the beam translationally over the substrate surface along a second path at a second orientation angle. For semiconductor wafer annealing applications, the photonic beam may illuminate no more than 5% of the substrate surface at one time and is effective to heat an illuminated portion of the substrate surface at a rate of at least 1000° C. per second.

The substrate may be processed by scanning the beam translationally over substantially the entire substrate surface at the first and second orientation angles. When the beam is scanned at substantially identical rates for the first and second orientation angles, the processed surface may exhibit reduced surface warpage relative to a surface that is processed in its entirety at once and/or relative to a surface that is scanned at a single orientation angle.

Typically, the first and second paths, when viewed from the first and second orientation angles, respectively, are substantially identical to each other. Thus, each of the first and second paths may cover substantially the entire substrate surface. In the alternative, the first and second paths may be different. In some instances, one of the first and second paths covers substantially the entire substrate surface while the other path covers only a selected portion of the substrate surface.

Each of the first and second paths may include a plurality of parallel segments. The segments may be linear and/or curved and may be spaced at a predetermined distance from each other so the illuminated sections along the parallel segments overlap. The predetermined distance is selected according to the intensity profile of the beam. The intensity profile may have a peak intensity region and the predetermined distance is selected so the peak intensity regions do not overlap.

In a further embodiment, the invention provides a method for processing a substrate to produce a desired surface contour. The substrate is produced by a method that starts out with a substrate having a surface having an initial surface contour profile. The method may involve producing a photonic beam suitable for processing the substrate surface and scanning the beam translationally over the substrate surface along a first path at a first orientation angle. As a result, the initial surface contour is converted into an intermediate surface contour. Then, the beam is scanned translationally over the substrate surface along a second path at a second orientation angle. The intermediate surface contour is then converted into the desired surface contour.

In yet another embodiment, the invention provides a method for reshaping a substrate having a surface with a contour unsuitable for subsequent processing. A photonic beam scans the beam translationally over the substrate surface along a selected path and a selected orientation angle to effect thermal processing. As a result, the surface is reshaped in a manner effective to convert the unsuitable surface contour into a contour suitable for subsequent processing.

In still another embodiment, a method is provided for improving the performance of a microelectronic circuit on a surface of a semiconductor substrate. The method involves generating a photonic beam suitable for producing a image having a shape and/or intensity profile suitable for thermally processing the substrate surface. The image is scanned translationally over the substrate surface at an orientation angle effective to produce a surface strain in a manner that enhances carrier mobility in the microelectronic circuit relative to carrier mobility of the circuit without the surface strain. The orientation angle may be selected to improve the performance of circuits that include PMOS and/or NMOS transistors.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 9A depicts the first scan path. FIG. 9B depicts the second scan path.

FIG. 10A depicts the first scan path. FIG. 10B depicts the second scan path.

FIG. 11A shows asymmetric warpage behavior typical of the single-step LSA process. FIG. 11B shows the more symmetric warpage behavior typical of the two-step LSA process.

FIG. 11A shows asymmetric warpage behavior typical of the single-step LSA process. FIG. 11B shows the more symmetric warpage behavior typical of the two-step LSA process.

FIG. 14A shows a beam image having a lengthwise axis parallel to the longitudinal transistor channel orientation. FIG. 14B shows a beam image having a lengthwise axis perpendicular to the longitudinal transistor channel orientation. FIG. 14C shows a beam image having a lengthwise axis at a orientation angle θ of approximately 45° relative to the longitudinal transistor channel orientation.

Figure 1:
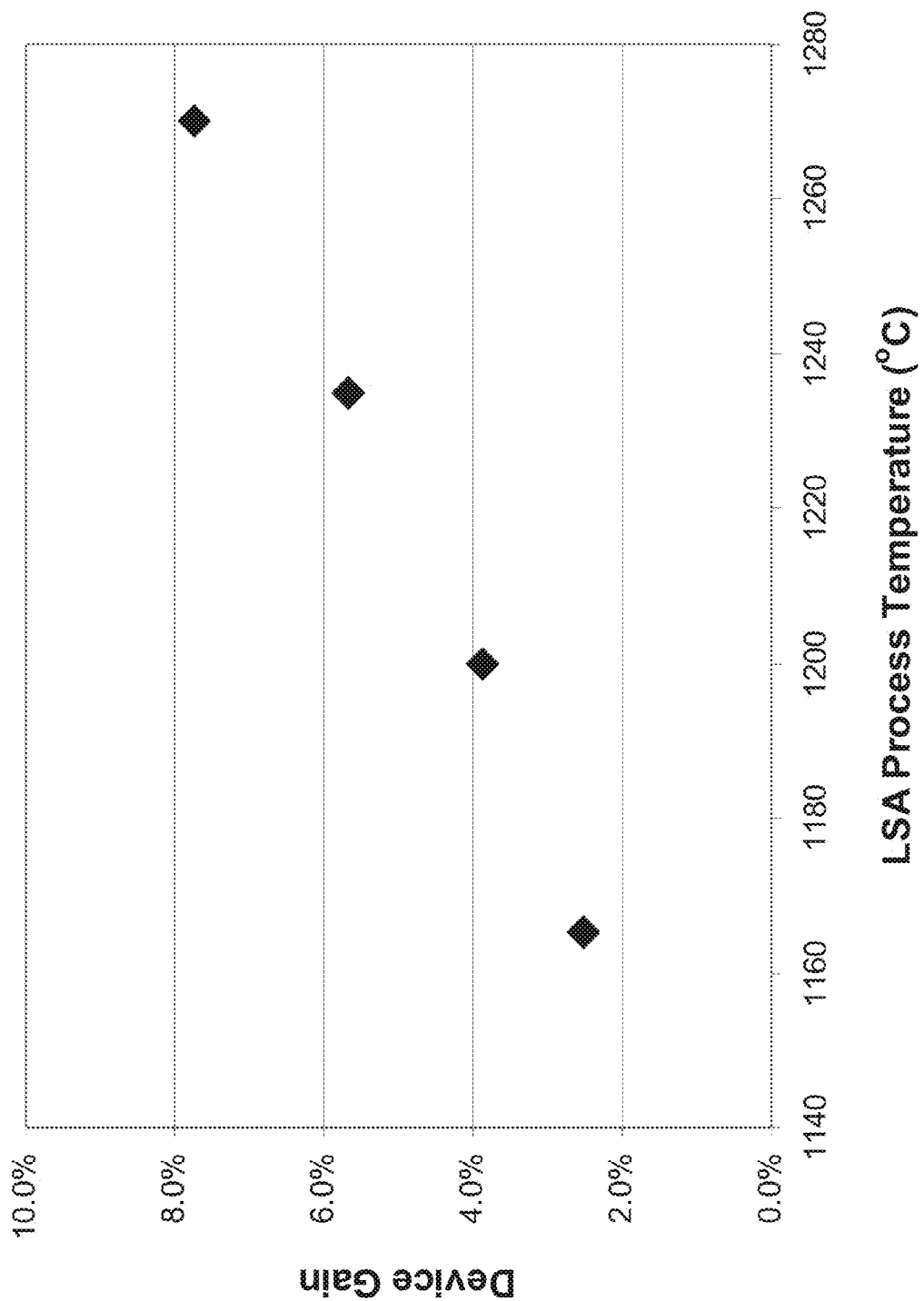
FIG. 1 is a graph that plots the percentage nMOSFET drive current gain relative to a baseline over a range of annealing temperatures using laser scanning.
Figure 2:
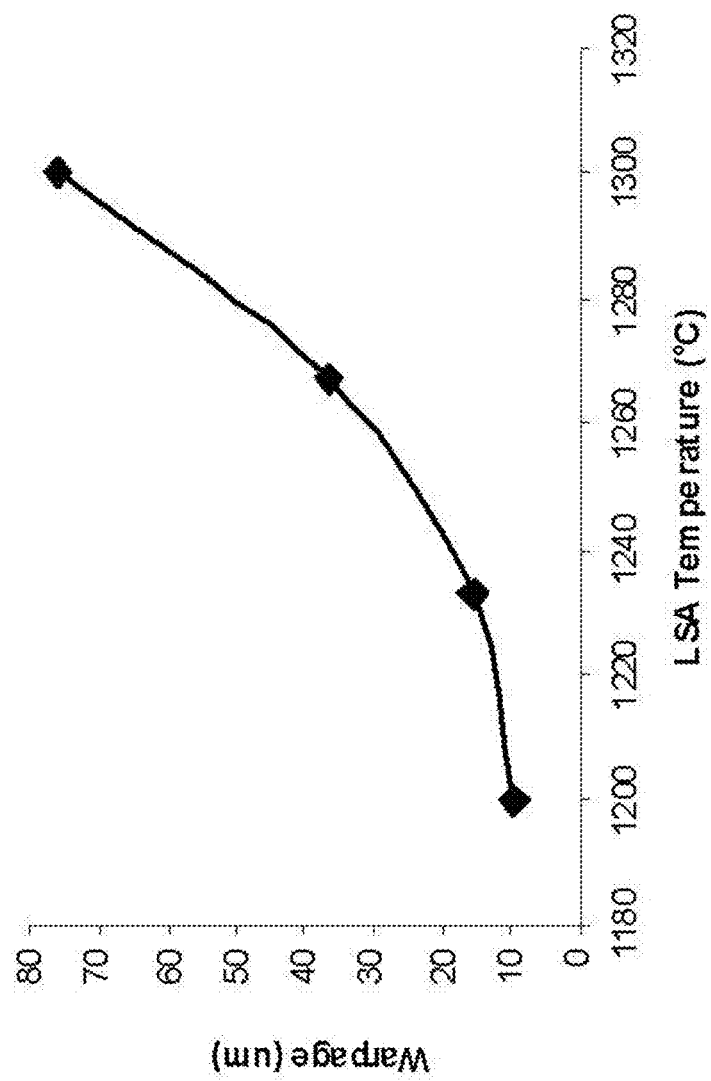
FIG. 2 is a graph that plots device wafer warpage over a range of annealing temperatures using laser scanning, showing that warpage increases with the annealing temperature.

The drawings are intended to illustrate various aspects of the invention, which can be understood and appropriately carried out by those of ordinary skill in the art. The drawings may not be to scale as certain features of the drawings may be exaggerated for emphasis and/or clarity of presentation.

DETAILED DESCRIPTION OF THE INVENTION

Definitions and Overview

Before describing the present invention in detail, it is to be understood that this invention, unless otherwise noted, is not limited to specific substrates, lasers, or materials, all of which may vary. It is also to be understood that the terminology used herein is for the purpose of describing particular embodiments only, and is not intended to be limiting.

It must be noted that, as used in this specification and the appended claims, the singular forms "a", "an" and "the" include both singular and plural referents unless the context clearly dictates otherwise. Thus, for example, reference to "a beam" includes a plurality of beams as well as a single beam, reference to "a wavelength" includes a range or plurality of wavelengths as well as a single wavelength, and the like.

In describing and claiming the present invention, the following terminology will be used in accordance with the following definitions.

The terms "Brewster's angle" or "Brewster angle" is used to refer to the angle of incidence between a radiation beam and a surface that corresponds to the minimum or near-minimum reflectivity of the P-polarized component of the beam. Films on the surface of an object, such as a silicon wafer, may prevent it from exhibiting zero reflectivity at any angle. If, however, the films are dielectric in nature, then there generally will be an angle of minimum reflectivity for P-polarized radiation. Accordingly, the Brewster's angle as used herein for a specular surface formed from a variety of different films stacked on a substrate can be thought of as having an effective Brewster's angle, or the angle at which the reflectivity of P-polarized radiation is at a minimum. This angle of minimum reflectivity typically coincides with or is near the angle of the Brewster's angle for the substrate material.

The term "intensity profile" in reference to an image or a beam refers to the distribution of the integrated radiation intensity along one or more dimensions. For example, an image may have a useful portion and a non-useful portion. The useful portion of an image typically has a "uniform" or constant integrated intensity profile over some portion of its length. In other words, the intensity profile integrated in the scan direction throughout the useful portion of the image may be substantially constant. Accordingly, any point on a substrate surface region that is scanned by a useful portion of an image having a uniform intensity profile will be heated to the same temperature. However, the intensity or intensity profile of the non-useful portion may differ from that of the useful portion. Thus, the image as a whole may have an overall "non-uniform" intensity profile even though a useful portion by itself may exhibit a uniform intensity profile.

As a related matter, the term "peak intensity region" of an image or a beam refers to the region along the beam length exhibiting the highest integrated intensity across the beam width. Typically, the entirety of the useful portion of an image will exhibit an integrated intensity very close to the peak integrated intensity.

As another related matter, the term "energy utilization" as in the "energy utilization of an image" refers to the proportion of energy associated with the portion of the image useful for producing a desired effect relative to the total beam energy in the image. For example, in an annealing application the "useful portion" of an image may be only that part of the beam that comes within about a percent or two of the maximum or peak beam intensity. In such a case, the "useful portion" exhibits a "substantially uniform" intensity. A small modification to the image profile shape can produce a large change in the "energy utilization".

The term "semiconductor" is used to refer to any of various solid substances having electrical conductivity greater than insulators yet less than good conductors, and that may be used as a base material for computer chips and other electronic devices. Semiconductors include elements such as silicon and germanium and compounds such as silicon carbide, aluminum phosphide, gallium arsenide, and indium antimonide. Unless otherwise noted, the term "semiconductor" includes any one or a combination of elemental and compound semiconductors, as well as strained semiconductors, e.g., semiconductors under tension or compression. Exemplary indirect bandgap semiconductors suitable for use with the invention include Si, Ge, and SiC. Direct bandgap semiconductors suitable for use with the invention include, for example, GaAs, GaN, and InP.

The terms "substantial" and "substantially" are used in their ordinary sense and refer to matters that are considerable in importance, value, degree, amount, extent or the like. For example, the phrase "substantially Gaussian in shape" refers to a shape that corresponds predominantly to the shape of a Gaussian probability distribution curve. However, a shape that is "substantially Gaussian" may exhibit some characteristics of a non-Gaussian curve as well, e.g., the curve may also include a non-Gaussian component.

Similarly, a "substantially uniform" intensity profile will contain a relatively flat portion where the intensity does not deviate more than a few percent from the profile's peak intensity. Preferably, the intensity deviation is less than about 2%. Optimally, the intensity deviation is no more than about 1% or no more than about 0.8%. Other uses of the term "substantially" involve an analogous definition.

The term "substrate" as used herein refers to any material having a surface, which is intended for processing. The substrate may be constructed in any of a number of forms, for example, a semiconductor wafer containing an array of chips, etc.

As alluded to above, the invention is generally directed to apparatuses and methods for thermally processing a substrate surface. A scanned photonic beam is used to heat the surface rapidly to a high annealing temperature to improve the performance of devices formed on the substrate surface. In particular, the invention takes advantage of specific laser orientation angles and scan paths to process the surface so as to effect rapid annealing thereof in a manner that does not result in detrimental substrate warpage.

An Exemplary Laser Annealing System

Figure 3:
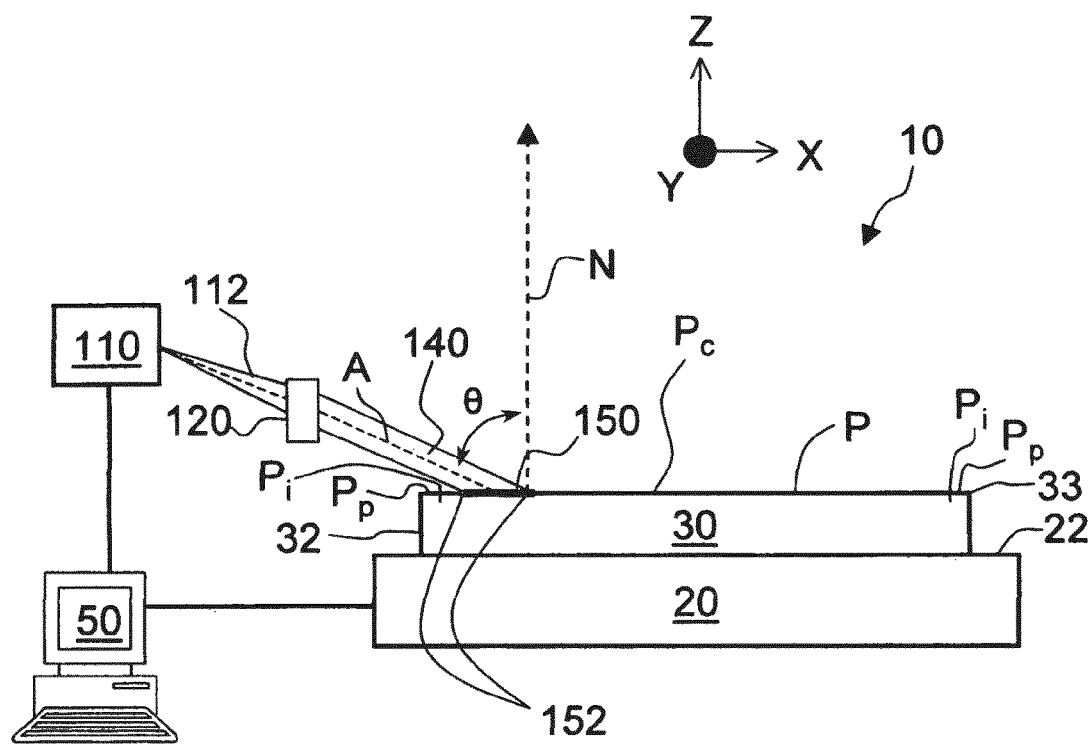
FIG. 3 is a schematic side view of an exemplary laser thermal processing geometry involving a substrate with an upper surface.

To illustrate the novel and non-obvious aspects of the invention, FIG. 3 schematically depicts a thermal processing apparatus 10 that may be used to anneal and/or otherwise thermally process one or more selected surface regions of a substrate according to the present invention. LTP system 10 includes a movable substrate stage 20 having an upper surface 22 that supports a semiconductor substrate 30 having an upper surface P and a surface normal, N, thereto. Substrate stage 20 is operably coupled to controller 50. Substrate stage 20 is adapted to move in the X-Y plane under the operation of controller 50 so the substrate can be scanned relative to the image generated from radiation provided by radiation source 110. The stage 20 may also controllably rotate substrate 30 about an axis Z which extends orthogonally relative to the X-Y plane. As a result, the stage 20 may controllably fix or alter the orientation of substrate 30 in the X-Y plane.

Optionally, the semiconductor substrate 30 may have a generally circular upper surface P and a surface normal N. Substrate 30 includes a side wall 32 interfacing via substrate edge 33 to a narrow annular peripheral portion $P_p$ of that circumscribes the central portion $P_c$ of upper surface P. Interface $P_i$ defines the boundary between the central portion $P_c$ and the peripheral portion $P_p$ of the upper surface P. In some instances, the central portion represents a region of the substrate where full yield is expected when producing semiconductor devices such as integrated circuits, and the peripheral portion represents an edge exclusion region, a portion of the substrate in which yield is not expected and sometimes where no device or portion thereof lies. In such a case, the central portion may be considered to occupy substantially the entire substrate surface.

The stage may include different components to carry out different functions. For example, an alignment system may be provided to position the substrate on the stage at a variable orientation angle relative to the surface normal. In such a case, the stage may independently control the substrate movement while the alignment system controls the substrate orientation.

The radiation source 110 is operably coupled to controller 50, and a relay 120 that serves to relay radiation generated by the radiation source toward the substrate to form an image on its surface. In an exemplary embodiment, radiation source 110 is a $CO_2$ laser that emits radiation at a wavelength $\lambda_H \sim 10.6$ μm (heating wavelength) in the form of beam 112. Alternatively, the radiation suitable for use with the invention may include LED or laser diode radiation as well, e.g., radiation having a wavelength of about 0.8 μm. Optionally, a plurality of radiation sources may be employed. As shown, the laser 110 generates an input beam 112 that is received by a relay 120 that is adapted to convert the input beam to an output beam 140 that forms an image 150 on the substrate.

Optionally, the intensity profile of the beam can be manipulated so a portion of the image intensity is rendered uniform about its peak intensity for even heating and high energy utilization. For example, the relay 120 may transform the input beam 112 into output beam 140. The relay may be constructed in a manner to provide for desired coherent beam shaping so the output beam exhibits a uniform intensity profile over a substantial portion thereof. In short, the relay 120 and the radiation source 110 in combination may stabilize, the directionality, intensity profile, and phase profile of the output beam to produce a consistently reliable laser annealing system.

Beam 140 travels along optical axis A, which makes an angle θ with a substrate surface normal N. Typically, it is not desirable to image a laser beam on a substrate at normal incidence, because any reflected light may cause instabilities when it returns to the laser cavity. Another reason for providing optical axis A at an incidence angle θ other than at normal incidence, is that efficiently coupling of beam 140 into the substrate 30 may best be accomplished by judicious choice of incidence angle and polarization direction, e.g., making the incidence angle equal to the Brewster's angle for the substrate and using p-polarized radiation. In any case, the stage may be adapted to scan the substrate through the beam position while preserving or altering the incidence angle. Similarly, the stage may be adapted to control, fix or vary the orientation angle of the substrate relative to the beam.

Beam 140 forms image 150 at substrate surface P. In an exemplary embodiment, image 150 is an elongate image, such as a line image, having its lengthwise boundaries indicated at 152, and located within a plane containing the incident beam axis and the surface normal (N). Lengthwise boundaries for images having a substantially Guassian intensity profile may represent the useful portion of the image for thermal processing. Accordingly, the incidence angle of the beam (θ) relative to the substrate surface may be measured in this plane. Surface incident angle θ may be, for example the (effective) Brewster angle for the substrate.

The controller may be programmed to provide relative movement between the stage and the beam. Depending on the desired process parameters, the controller may provide different types of relative movement. As a result, the image 150 may be scanned across different paths, e.g., as discussed in detail below, on the substrate surface to heat at least a portion of the substrate surface. Such scanning may be carried out in a manner effective to achieve a desired temperature within a predetermined dwell time, D, e.g., less than 1 millisecond. Scanning may typically be performed in a direction that is orthogonal to the lengthwise axis of the image although this is not a firm requirement. Non-orthogonal and non-parallel scanning may be carried out as well.

A means may also be included to provide feedback of the uniformity of the maximum temperature achieved. Various temperature measuring means and methods may be used with the invention. For example, a detector array might be used to take a snap-shot of the emitted radiation distribution over the surface or multiple snap-shots might be used to derive a map of the maximum temperature as a function of the position across the length of the beam image. Optionally, a means for measuring the intensity profile of the beam on the substrate may be used as well.

Optimally, a real-time temperature measurement system may be employed. An exemplary temperature measurement system is described in U.S. Patent Application Publication No. 2006/0255017, entitled "Methods and Apparatus for Remote Temperature Measurement of a Specular Surface" published on Nov. 16, 2006. Such temperature measurement systems may be used to provide input to the controller so appropriate corrections can be made possibly by adjusting the radiation source, the relay or the scanning velocity.

Scan Paths

Figure 4:
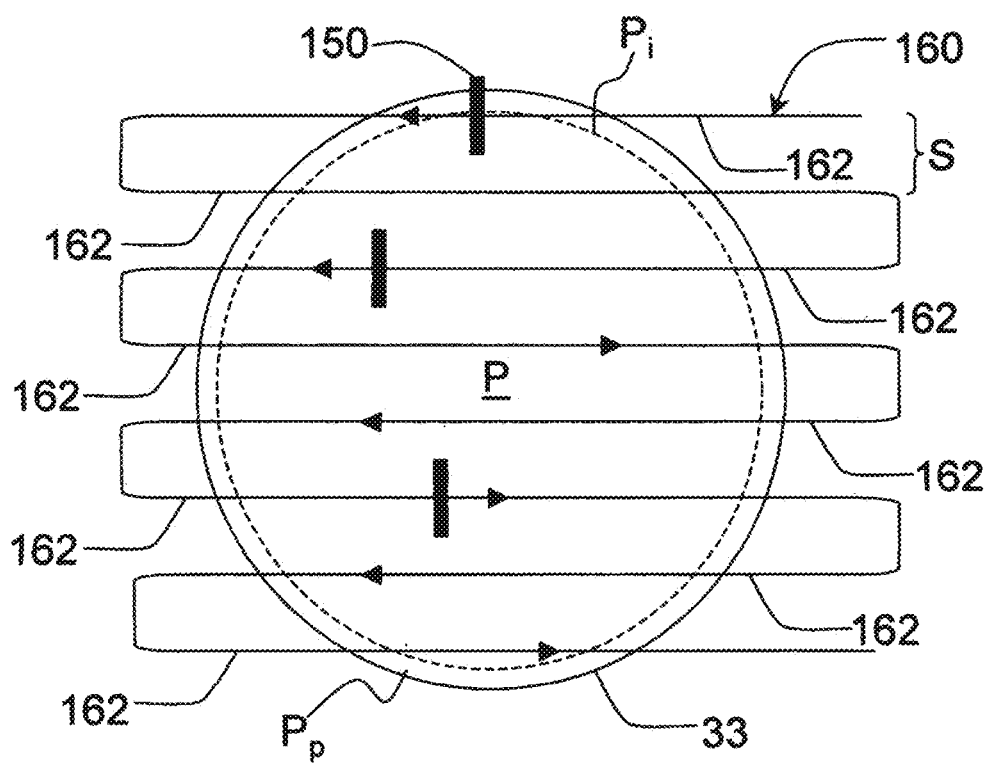
FIG. 4 is a plan view of a substrate surface and an exemplary image scan path thereon having a plurality of linear segments.

As alluded to above, the system shown in FIG. 3 may be used to scan a laser image over a substrate surface in a number of different ways to address a number of processing issues. FIG. 4 depicts in plan view of an exemplary scan path 160 traveled by image 150 when irradiating substrate surface P when relative motion is provided between the beam segments. As shown, the alternating back and forth or "X-Y" scan path includes a plurality of parallel linear scanning segments 162 along the Y direction. The segments 162 are uniformly spaced with neighboring segments spaced apart at a segment-to segment distance S. FIG. 4 also shows that path 160 allows image 150 to process substantially the entire substrate surface P.

Figure 5:
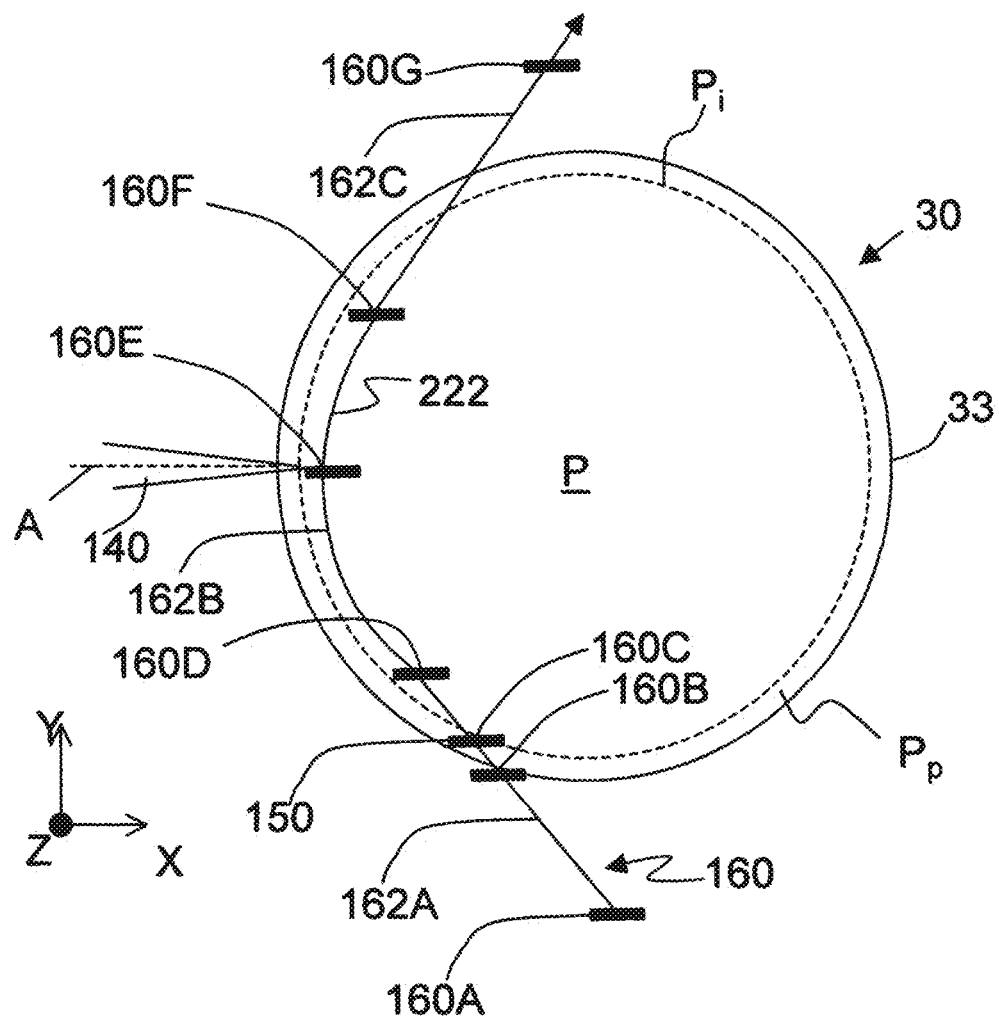
FIG. 5 is a plan view of a substrate surface and an image scan path having an arcuate segment.

Alternatively, as discussed in U.S. Pat. No. 7,238,915 to Grek et al., scan paths having both linear and arcuate scan path segments may be employed, e.g., to avoid edge damage. For example, FIG. 5 depicts in plan view substrate surface P being irradiated by radiation beam 140 over a single scan path 160 traversed by line image 150. In FIG. 5, scan path 160 starts off surface P at position 160A and along a linear segment 162A past progressive positions 160B (located at substrate edge 33), 160C and 160D. Line image 150 continues along scan path 160 following an arcuate scan path segment 162B that is parallel with substrate edge 33. Segment 162B includes positions 160E and 160F. At position 160F, arcuate segment 162B connects to linear segment 162C. Thus, continuing along scan path 160, line image 150 traverses off-surface position 160G.

Figure 6:
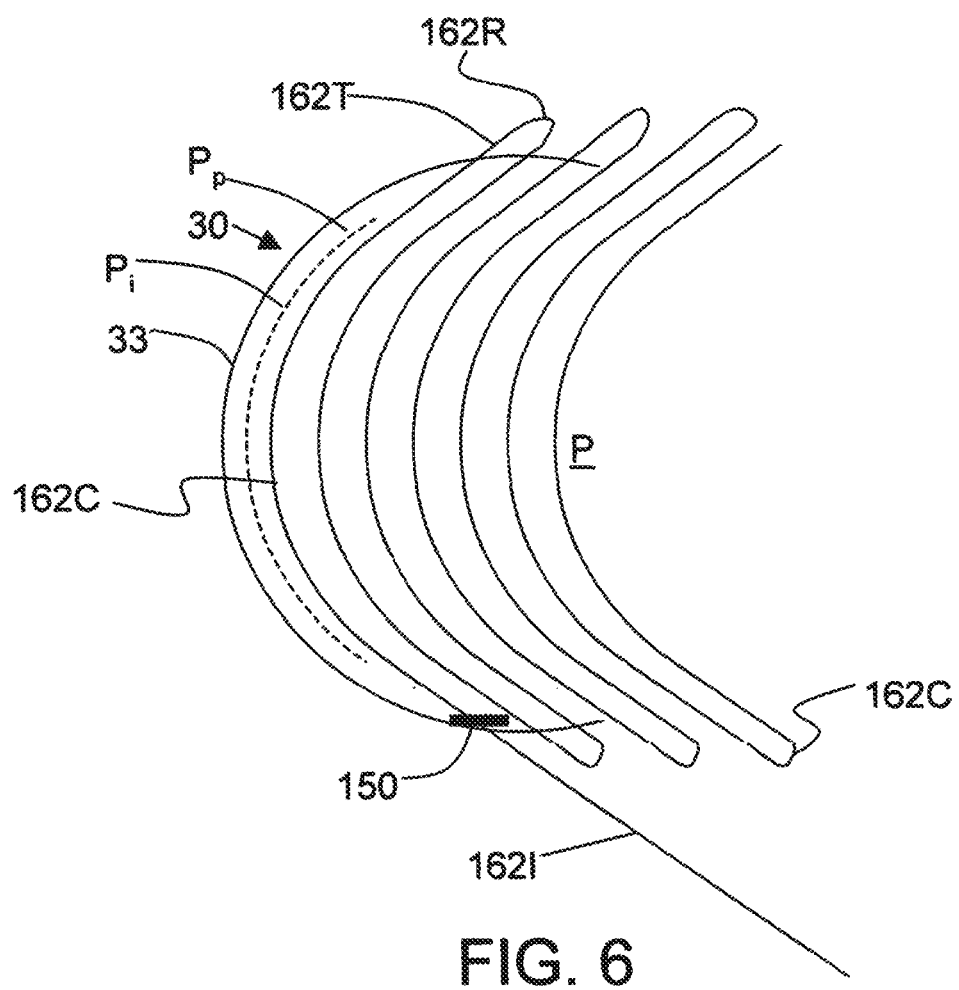
FIG. 6 is a plan view of an exemplary scan path for a line image that traverses over substantially an entire substrate surface, wherein the scan path includes a plurality of parallel arcuate scan path segments coupled to each other through transition segments that bring the line image off of and onto the substrate surface.

FIG. 6 depicts in plan view an exemplary alternating back and forth scan path that includes a plurality of parallel curved segments. As shown, scan path 160 includes an initial linear scan path segment 1621 that brings line image 150 initially into contact with substrate 30. Once image 150 falls completely on substrate surface P, the linear scan path segment 1621 transitions to the first of a number of arcuate scan path segments 162C that follow the curvature of boundary $P_i$. Adjacent arcuate scan path segments 162C have a similar shape that are laterally displaced by a predetermined distance. Typically the predetermined distance is related to the length and intensity profile of line image 150. In addition, arcuate segments 162C may each have a radius equal to the substrate radius minus the width of the periphery region $P_p$.

Figure 7:
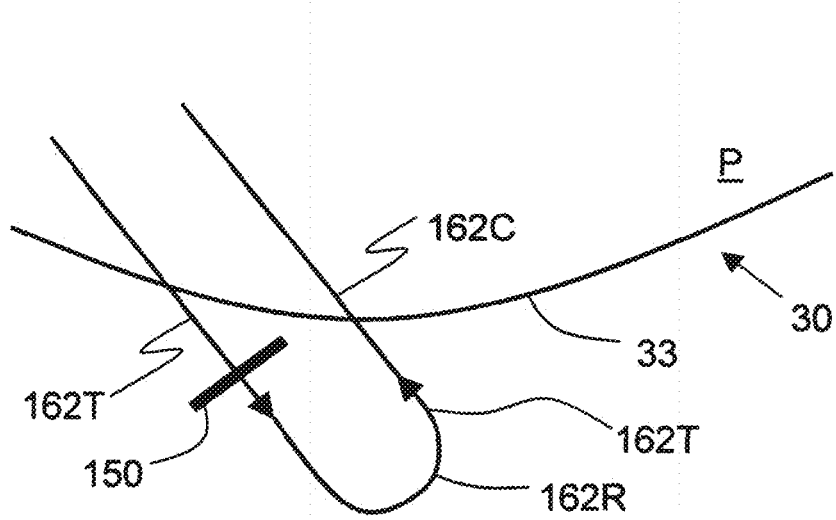
FIG. 7 is a close-up view of the scan path of FIG. 6, showing two transition scan path segments connected to a turn-around scan path segment near the edge of the substrate.

Arcuate scan path segments 162C are connected to transition scan path segments 162T where the image travels off of, and back onto, the substrate. Adjacent transition scan path segments 162T are connected via turn-around segments 162R. FIG. 7 is a close-up view of a portion of scan path 160 near the substrate edge 33 illustrating two transition segments connected by a turn-around segment 162R. Turn-around segments 162R are located away from the substrate edge and off surface P so image 150 does not fall on the substrate surface during the transition between adjacent scan segments when the scanning velocity changes substantially. The turn-around segments 162R have to be long enough so the stage velocity can be reversed and brought up to the required speed before the line image again touches the substrate edge.

For any scan path, the controller 50 may be is programmed to move stage 20 via control signals to cause substrate 30 to follow scan path 160. As a result, substantially the entire substrate surface P is thermally processed with radiation beam 20. This procedure requires, among other things, coordinated motion in the X and Y scanning axis of stage 20 to produce an appropriate scan path.

Surface Warpage

As discussed above, higher annealing temperatures are generally desirable because higher annealing temperatures tend to give rise to improved device performance. However, it has been observed that wafers processed using scanned laser beams tend to become warped and that warpage generally increases with higher LSA temperature. It has now been discovered that warpage behavior may differ depending on scan path as well as other parameters associated with thermal processing.

Figure 8:
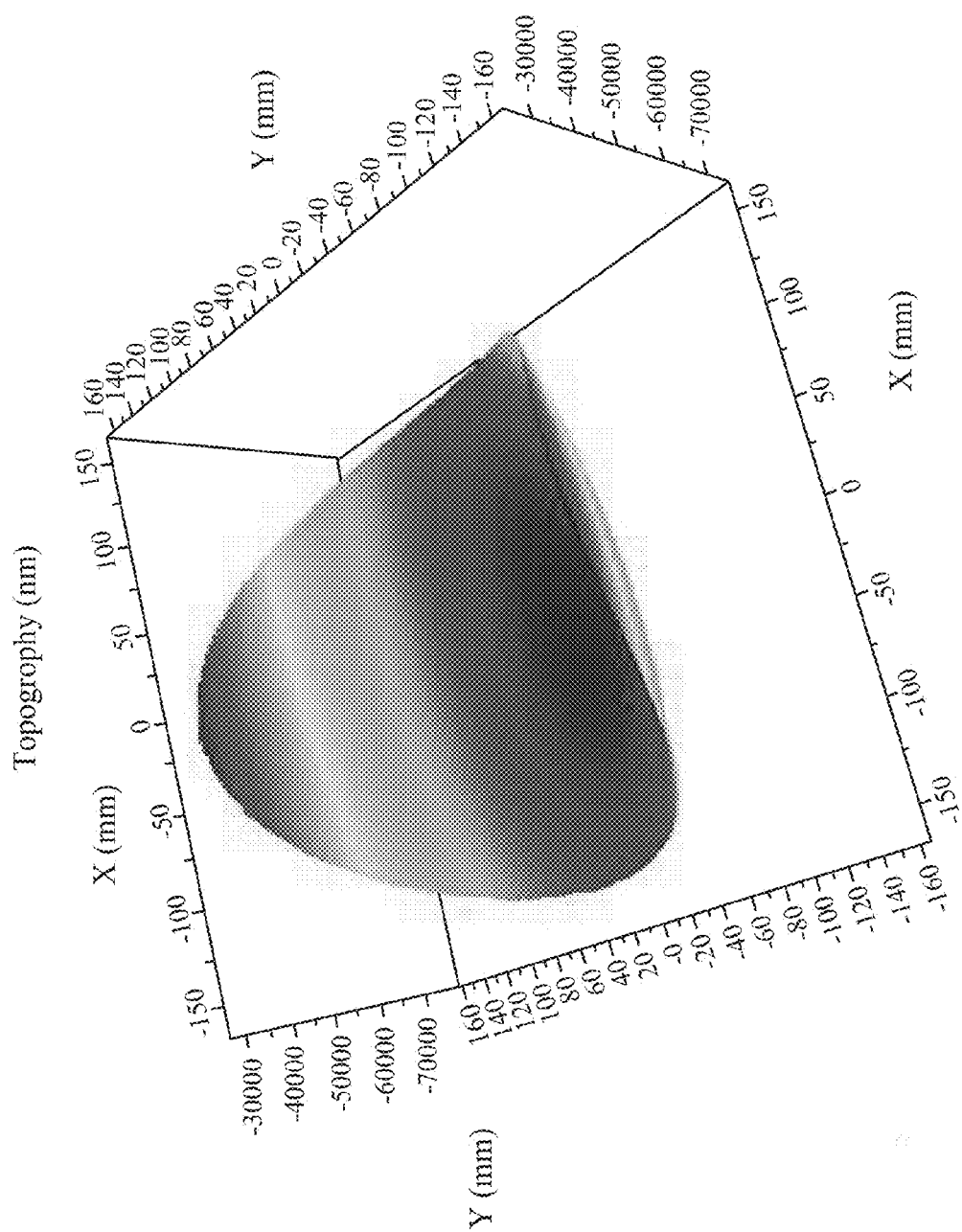
FIG. 8 shows the typical "bowed" wafer topography after LSA processing using a scan path similar to that shown in FIG. 4.

For example, it has been observed that LSA processes for wafers that use an alternating scan path similar to that depicted in FIG. 4 tend to bow wafers in the manner shown in FIG. 8. As shown, warpage in the Y direction is much larger than that in the X direction, resulting in a "chip-like" profile. That is, FIG. 8 shows that wafers tend to preferentially bow in the lengthwise direction of the image scanned on the wafer. As shown, warpage in the lengthwise direction may be greater than 5 times that in the widthwise direction.

Surface warpage is problematic because integrated circuit manufacturing processes typically require tight tolerance on wafer warpages for annealing processes. For silicon wafers of 300 mm diameter, the tolerance is typically on the order of 5 µm or less across its diameter. Thus, asymmetric warpage is particularly problematic because excessive warpage in one direction may render a wafer unsuitable for subsequent processing, even if the wafer warpage in another direction conforms to the process tolerances.

It has now been discovered that assymetric warpage may be reduced by a multiple-step process in which a beam is scanned translationally over the substrate surface along a first path at a first orientation angle followed by translational beam scanning over the substrate surface along a second path at a second orientation angle. For example, LSA systems may be adapted to carry out a two-step wafer annealing process at a stepping size of full beam length. The process involves first scanning a beam translationally over a wafer surface along a first scan path. As a result, the wafer surface may be asymmetrically warped. Then, the wafer is rotated 90° before the beam is scanned again over the surface along a second scan path. While the scan paths may be identical when viewed from the perspective of the beam, the scan paths, due to the wafer rotation, are rotationally offset from each other by 90°. As a result of the second scan, both the overall warpage of the surface as well as the asymmetry of the warpage may be reduced.

Figure 9A:
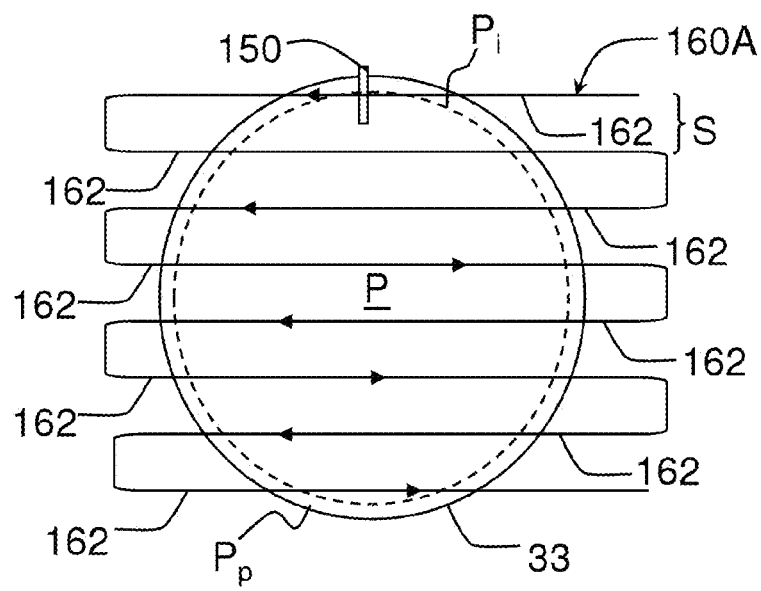
FIGS. 9A and 9B, collectively referred to as FIG. 9, depict scan paths associated with a two-step scanning process using two identical and rotationally offset scan paths.
Figure 9B:
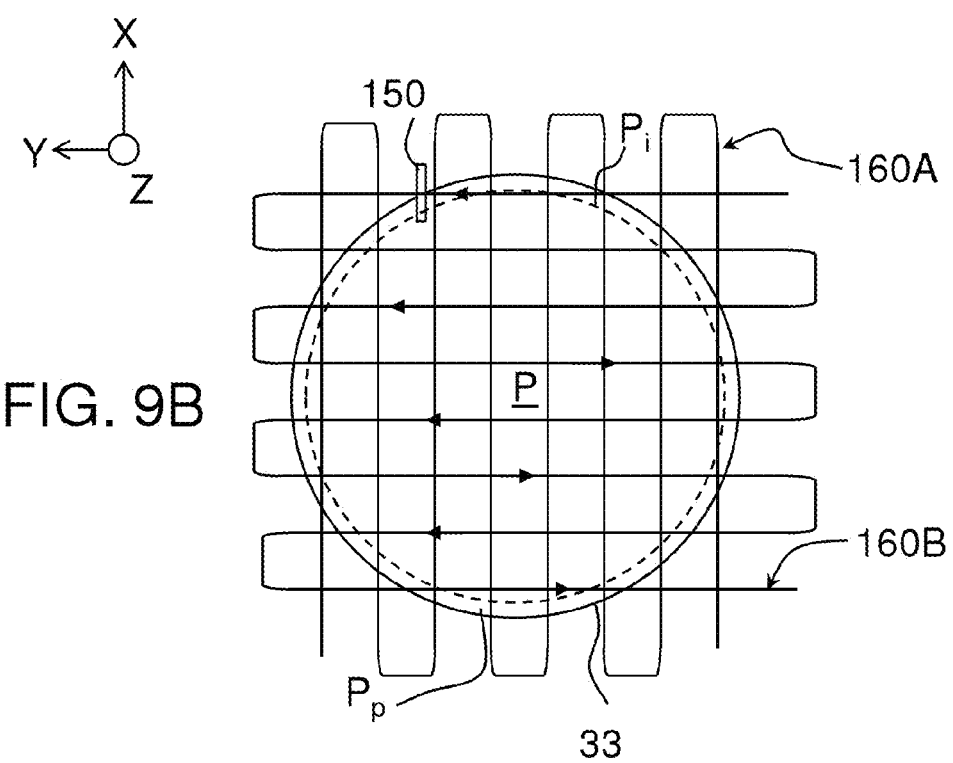

The scan paths of the above-described two-step wafer annealing process are depicted in FIG. 9. As shown in FIG. 9A, the first scan path 160A traveled by image 150 includes a plurality of parallel linear scanning segments 162 along the Y direction over the wafer. The segments 162 are uniformly spaced with neighboring segments spaced apart a segment-to segment distance S which corresponds to the length of image 150 to allow the image to process substantially the entire wafer surface. Then, as shown in FIG. 9B, the wafer is rotated 90° with segments 162 aligned along the X direction. Again, the wafer is scanned by image 150. The second scan path 160B is substantially identical to the first scan path 160A before wafer rotation.

Figure 10A:
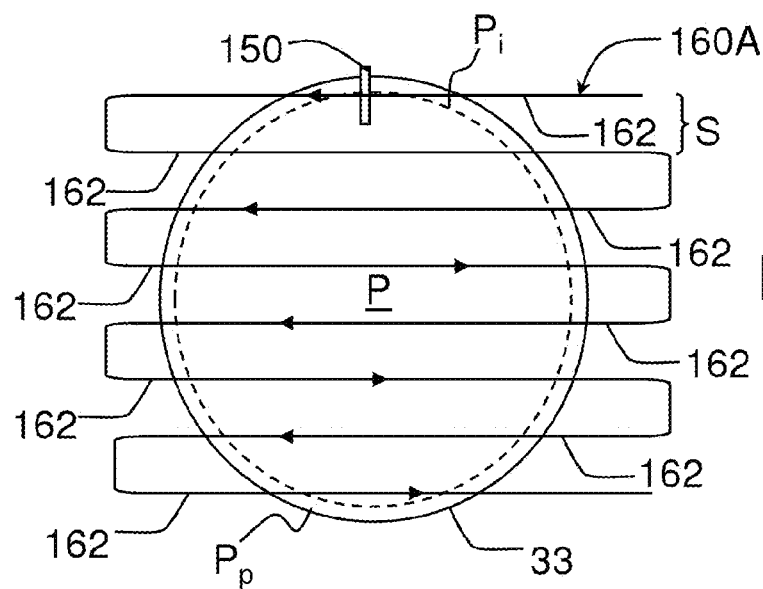
FIGS. 10A and 10B, collectively referred to as FIG. 10, depict scan paths associated with a two-step scanning process using different scan paths.
Figure 10B:
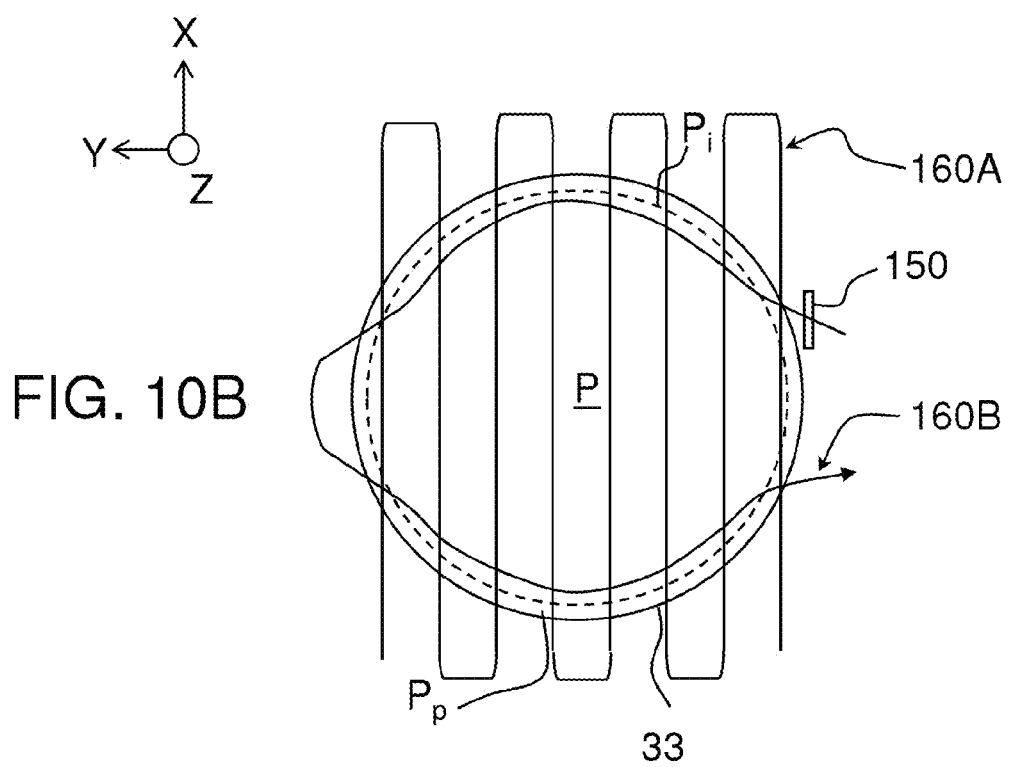

In some instances, multiple-step wafer annealing processes may employ different scanning paths. Different scanning paths may be advantageously used to increase the rate of processing throughput. As shown in FIG. 10A, LSA systems may be adapted to carry out a two-step wafer annealing process, similar to that discussed above in the first scanning step, carried out with the beam scanned translationally over a wafer surface along a first scan path to allow the image to process substantially the entire wafer surface. However, after the wafer is rotated 90°, as shown in FIG. 10B, only an edge portion of the wafer is scanned to allow the second step to reduce the warpage resulting from the first step.

Experimental results show that laser induced wafer warpage may be reduced through the use of the invention. For example, an experiment was carried out to compare a two-step LSA process with a single-step LSA process relative to substantially identical boron-implanted silicon wafers. Both processes involved using the same beam scanned at the same scan rate over the wafer surface. As a result, scanned regions for both processes reached a substantially identical peak temperature of 1350° C. In addition, both processes used the same thermal budget. In the single step LSA process, the segment-to-segment distance corresponds to half of the image length. In contrast, the two-step LSA process involved two scan paths rotationally offset from each other by 90° with segment-to-segment distances that correspond to the image length.

Figure 11A:
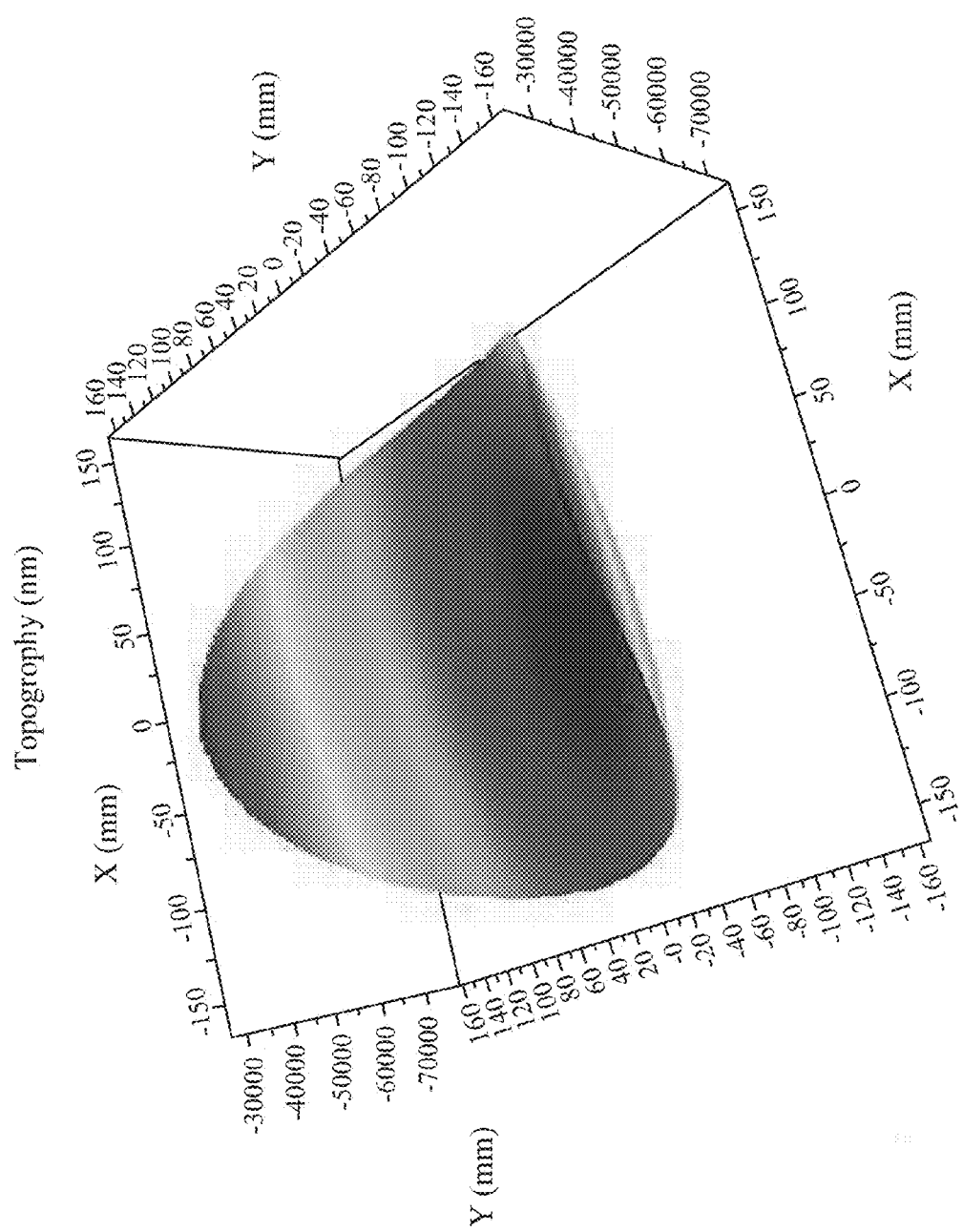
FIGS. 11A and 11B, collectively referred to as FIG. 11, show the results of an experiment carried out to compare a two-step LSA process with a single-step LSA process relative to substantially identical boron-implanted silicon wafers.
Figure 11B:
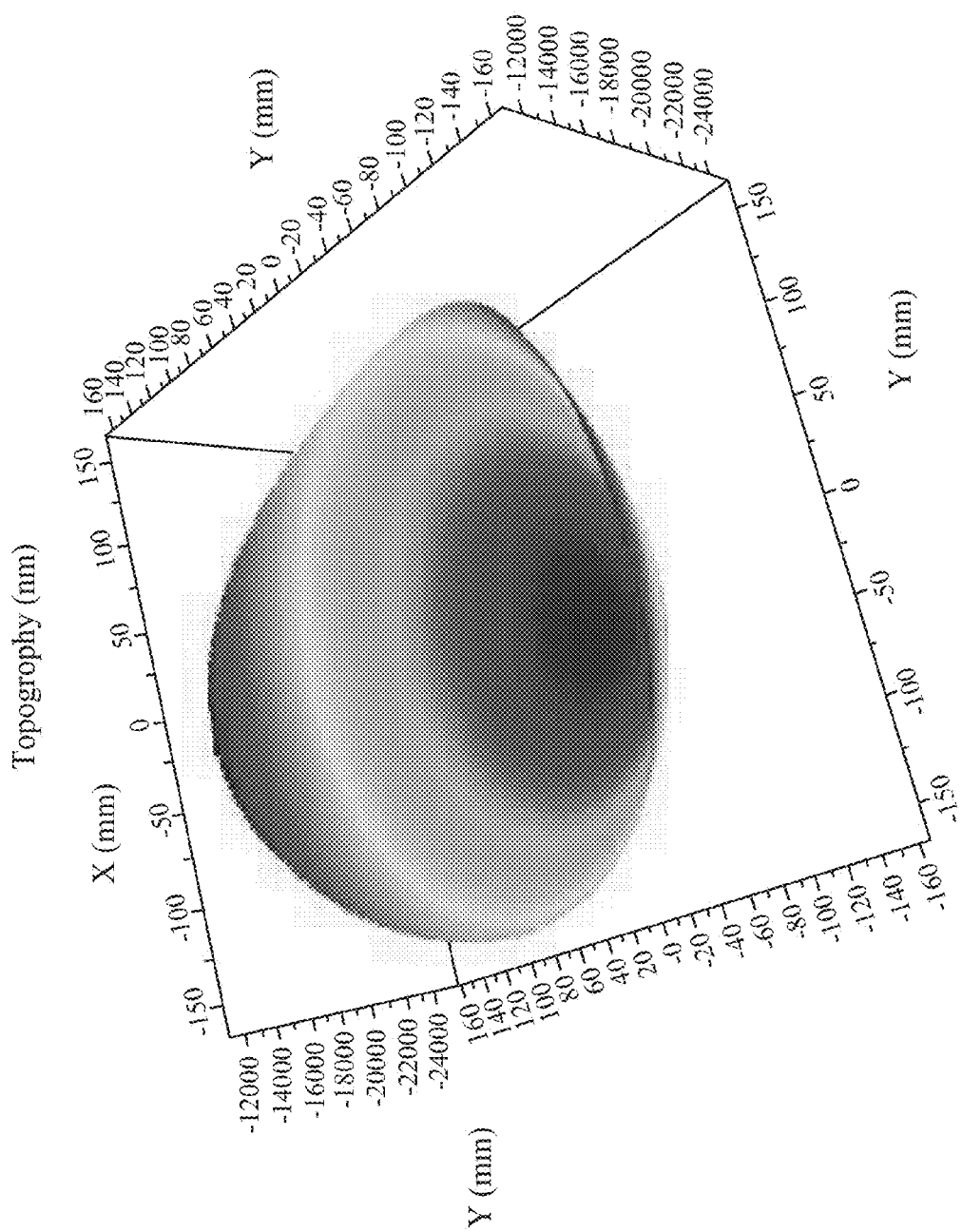

Results of this experiment are shown in FIG. 11. FIG. 11A shows asymmetric warpage behavior typical of the single-step LSA process. FIG. 11B shows the more symmetric warpage behavior typical of the two-step LSA process. As the wafer warpage associated with the single-step process and two-step processes were measured at 50.5 µm and 19.6 µm, respectively, it is apparent that the two-step process resulted in a more symmetric wafer surface and exhibited approximately a two-fold improvement over the one-step process.

Figure 12A:
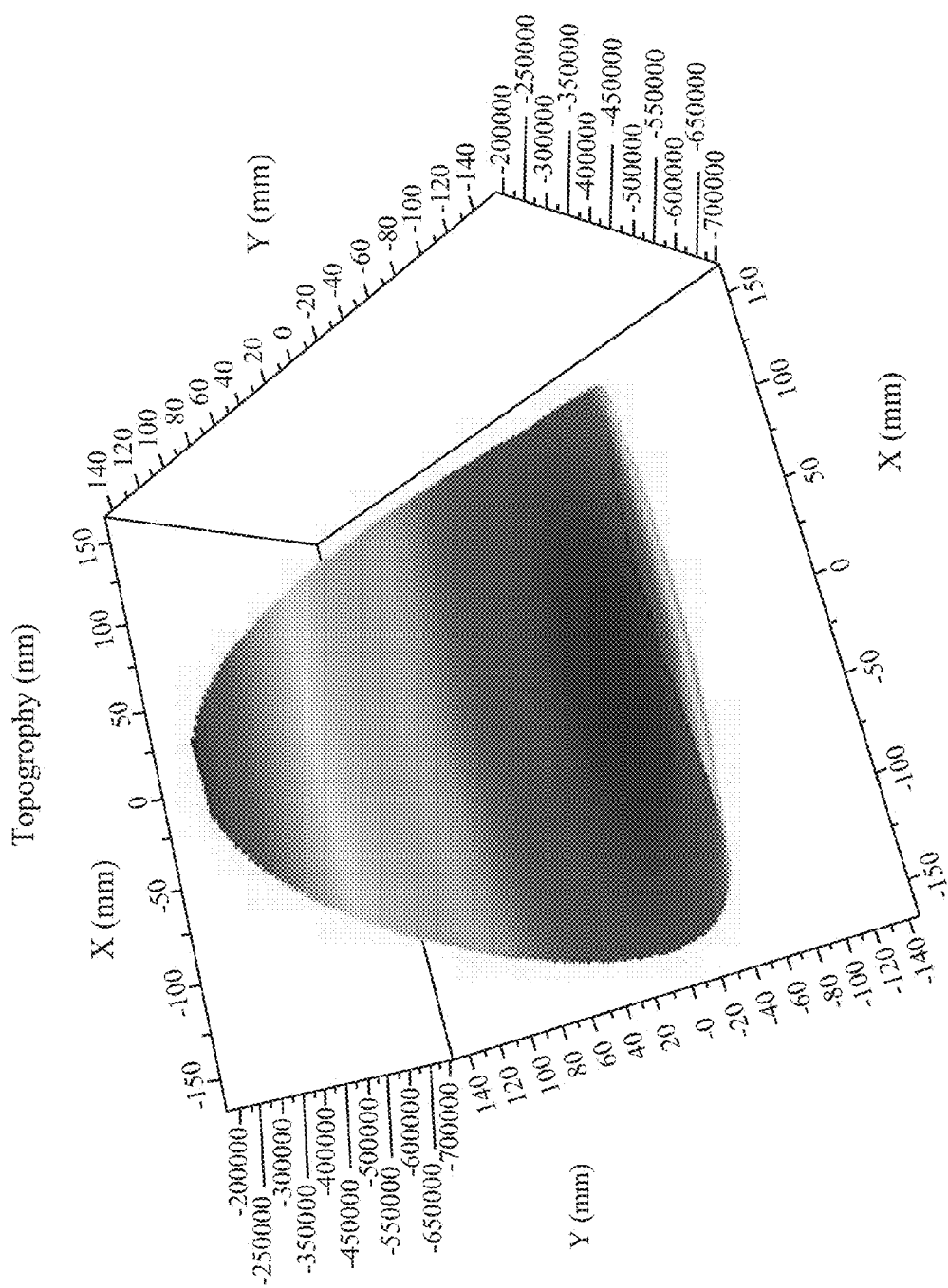
FIGS. 12A and 12B, collectively referred to as FIG. 12, show the results of an experiment carried out to compare a two-step LSA process with a single-step LSA process relative to substantially identical SiGe.
Figure 12B:
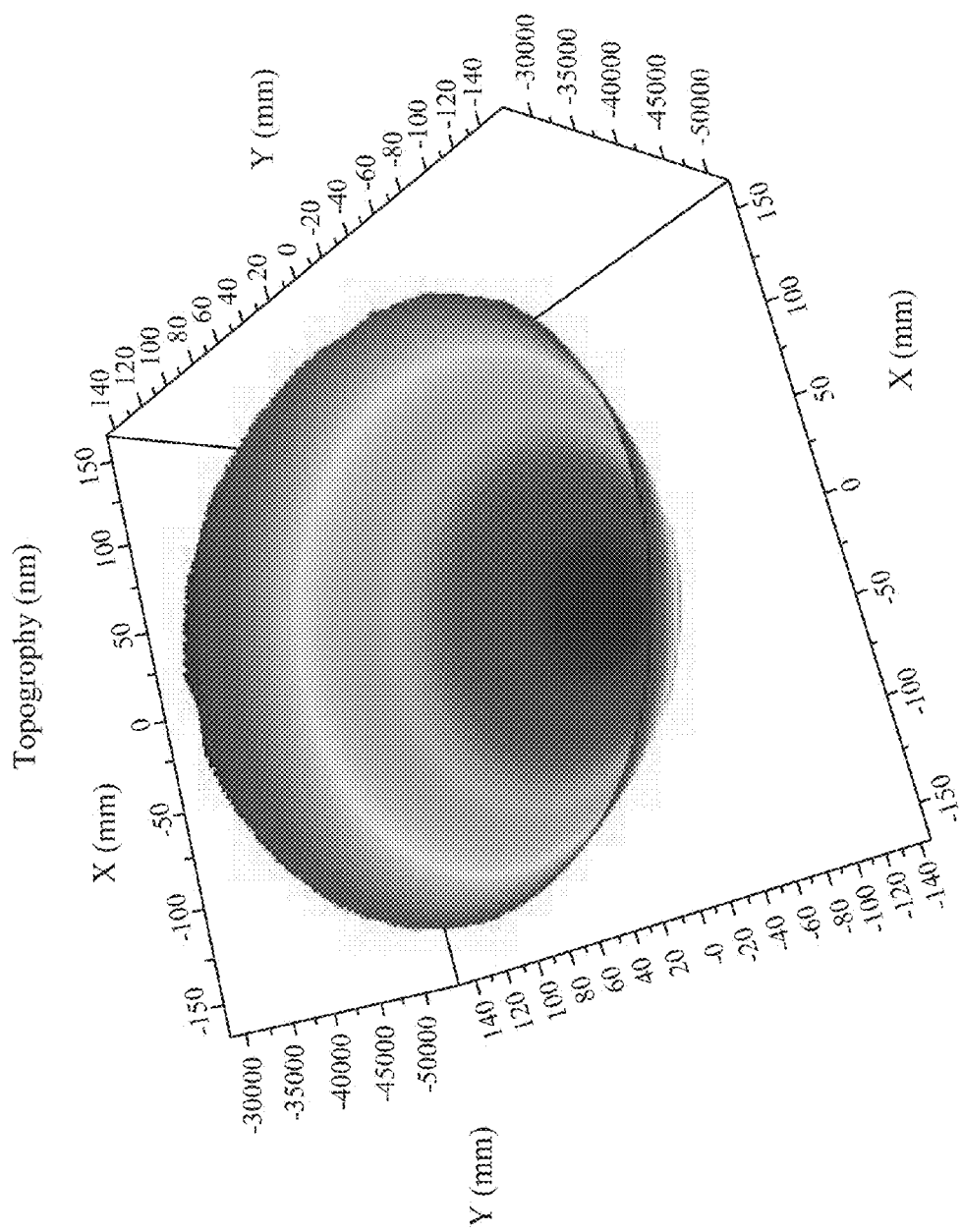

The experiment was repeated for SiGe wafers except at a lower peak temperature of 1200° C. The results of the SiGe wafer experiments are shown in FIG. 12. As shown in FIG. 12A, the single-step processes yielded a warpage measurement of 450 µm whereas the two-step processes, shown in FIG. 12B, yielded a warpage measurement of 209 µm. Again, the two-step process resulted in a more symmetric wafer surface and exhibited approximately a two-fold improvement over the one-step process.

While a number of factors may contribute to wafer warpage in the context of laser annealing, experimental data tends to indicate that the shape and intensity of the image formed on the substrate surface has a much greater effect on substrate strain than the directionality of the scan path. Similarly, experimental results show that warpage can also be reduced by optimizing the laser beam orientation (long axis) with respect to the crystallographic orientation of the substrate. For example, it is found that for a (100) silicon substrate with epitaxially grown $Si_xGe_{1-x}$ films, warpage will be smaller if annealed with a laser beam orientation parallel to <100> crystallographic direction compared to <110> direction.

Thus, the invention provides, in another embodiment, a method for processing a surface of a substrate that involves generating a photonic beam for processing the surface of a semiconductor substrate having a predetermined crystallographic orientation. The beam is directed to form an elongate image suitable for processing the surface. The image is scanned translationally over substantially the substrate surface in its entirely at an orientation angle selected according to the predetermined crystallographic orientation. The predetermined crystallographic orientation may be selected to reduce wafer warpage.

Controlled Thermally Induced Strain

As alluded to above, laser beams, during an annealing processes, may produce localized stresses and strains that result in wafer warpage. Also as alluded to above, strain engineering has recently been used to boost transistor performance for microelectronic circuits on semiconductor wafers. Thus, it should be evident that a laser beam's shape, intensity, and/or orientation can be optimized with respect to wafer crystal orientation and transistor layout so the induced strain can maximize the carrier mobility in the direction of carrier transport and hence improve the performance of transistors.

As an example, an elongate laser image having a length on the order of millimeters to centimeters and a width of approximately 100 micrometers may be scanned on the surface of a silicon wafer to anneal the wafer. The peak surface temperature lies below the melting point of silicon and typically within a range of about 1100° C. to about 1411° C. The time a fixed point on the wafer is exposed to the laser image is on the order of 0.1 to 3.0 milliseconds. The heat diffusion length in this time scale is about 30 to about 200 micrometers which is much smaller than typical wafer thickness of about 725 to about 775 micrometers. Hence only a thin top layer is effectively heated.

Models simulating a two-dimensional temperature distribution in a silicon wafer under a scanning laser show that both lateral and vertical heating are strongly localized. The steep thermal gradient causes non-uniform thermal expansion. When heated, a surface will expand more than the bulk silicon underneath it because of higher surface temperature. This leads to a compressive surface stress. After cooling, however, a residual tensile stress will develop if the distorted lattice can not fully recover to its room temperature equilibrium position. Due to the large aspect ratio of a laser beam, the residual tensile stress is asymmetric in the short and long beam direction.

Figure 13:
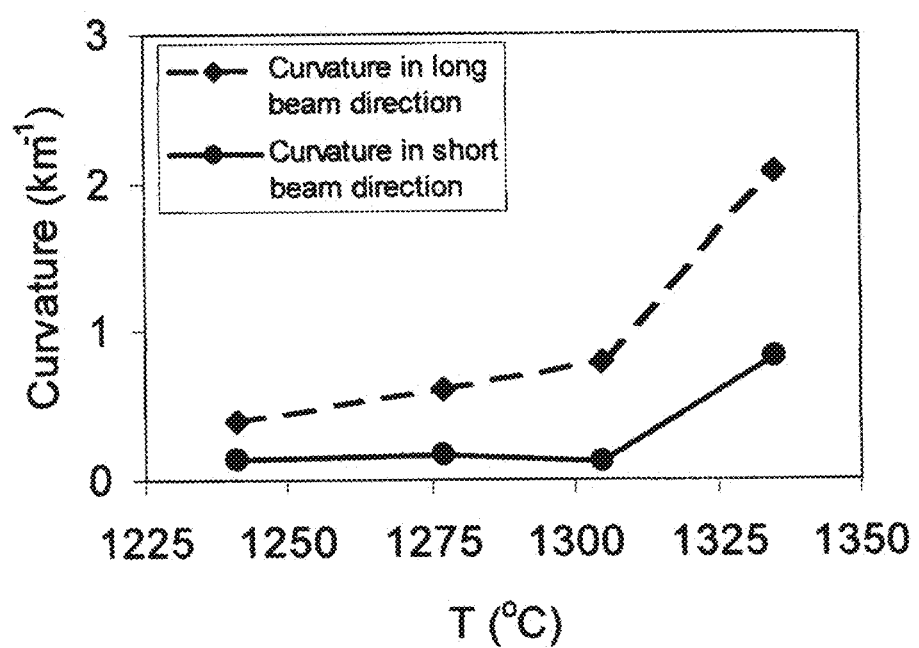
FIG. 13 is a graph that plots measured surface curvature versus peak laser annealing temperatures in lengthwise and widthwise beam directions.

FIG. 13 shows measured curvature of a laser-annealed wafer as a function of peak annealing temperature. The curvature is driven by the residual stress. Positive curvature indicates tensile stress. Stress in the lengthwise image direction is much larger than that in the widthwise image direction.

It should be noted that the performance of NMOS and PMOS devices may be optimized in different ways due to the differences in piezo-resistance coefficients for N-type and P-type silicon. The piezo-resistance coefficient also depends on how electrical current flows with respect to crystal orientation and uni-axial stress direction. For integrated circuit applications, transistors are typically built on (100) silicon substrate with channel (current flow direction) parallel to <100> or <110> crystal orientation. Table I lists the percent of linear drain current enhancement per 100 MPa tensile stress for various combination of channel orientations and stress directions. For <110> channel NMOS, tensile stress is desirable in both longitudinal and transverse directions, while for <110> channel PMOS, tensile stress is preferred in the transverse direction while compressive stress is desired in the longitudinal direction.

TABLE I

| Channel Orientation | Device Type | Longitudinal (Channel) Stress | Transverse (Width) Stress | Vertical Stress |
| --- | --- | --- | --- | --- |
| [110] | NMOS | 3.1 | 1.8 | −5.3 |
| [110] | PMOS | −7.2 | 6.6 | 0.1 |
| [100] | NMOS | 10.2 | −5.3 | −5.3 |
| [100] | PMOS | −0.7 | 0.1 | 0.1 |

Figure 14A:
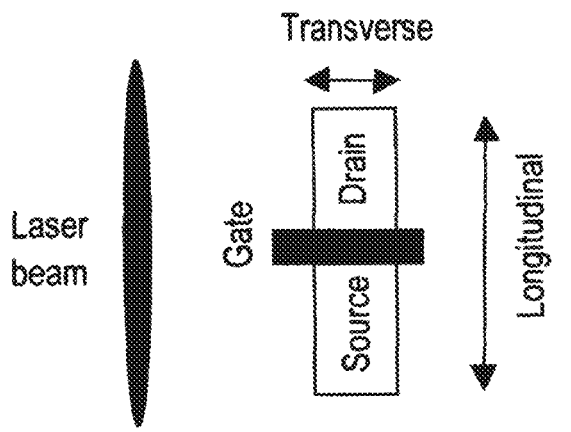
FIGS. 14A-14C, collectively referred to as FIG. 14, schematically illustrate various orientation relationships possible between the laser beam image relative to transistor channel orientations.
Figure 14B:
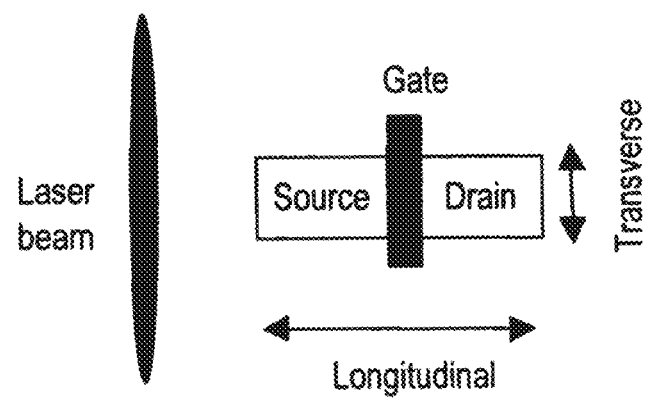
Figure 14C:
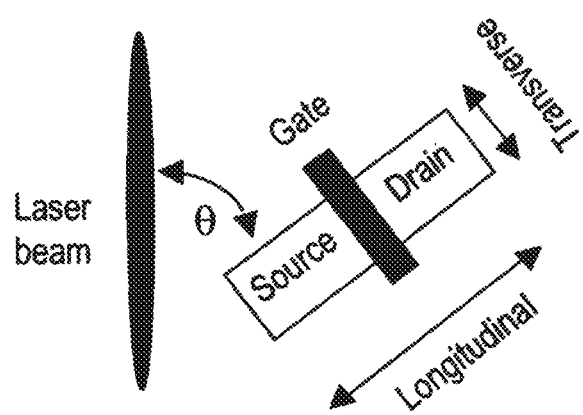

Thus, proper application of laser heating technology to induce asymmetrical tensile stress can be utilized to optimize the transistor performance in view of silicon's anisotropic piezo-resistance property. For example, for an [100] channel NMOS on (100) Si substrate, the lengthwise beam direction, as shown in FIG. 14A should be parallel to the channel layout during the scanning. This creates large longitudinal tensile stress that is beneficial yet only small transverse tensile stress that is undesirable to NMOS. The impact on PMOS is minimal because of much smaller piezo-resistance coefficients.

For an [110] channel layout on (100) substrate, the situation is more complicated. To maximize the NMOS performance, the lengthwise beam direction should still be parallel to the NMOS channel orientation. To maximize the PMOS performance, however, the lengthwise beam direction should be perpendicular to the PMOS channel orientation. Thus, one can, in principle, layout the NMOS channel orientation at 90° with respect to PMOS channel orientation to maximize the gain for both N & PMOS during the same laser scan. In any case, Table II summarizes the impact of laser beam direction on transistor performance for (100) silicon substrate.

TABLE II

| Channel Orientation | Laser Beam Direction | Impact on NMOS | Impact on PMOS |
| --- | --- | --- | --- |
| [100] | Parallel to channel orientation | ++ | 0 |
| [100] | Perpendicular to channel orientation | − | 0 |
| [110] | Parallel to channel orientation | + | − |
| [110] | Perpendicular to channel orientation | + | + |

Nevertheless, the NMOS & PMOS channels are often positioned along the same direction for better lithographic resolution. In this case, aligning lengthwise beam direction perpendicular to the channel orientation will maximize PMOS gain while also improve NMOS. Alternately, the beam can be directed at an angle with respect to the channel orientation. By adjusting the angle, the tradeoff between NMOS & PMOS performance can be tuned. It is also possible to use multiple annealing scans with different orientation angles to achieve the desired stress distribution. For example, one can align the lengthwise beam direction parallel to the channel in a laser annealing scan and perpendicular to the channel in a subsequent laser-annealing scan. This creates an accumulative residual tensile stress that is more symmetric in longitudinal and transverse channel directions. As a result, NMOS performance is maximized with only small impact on PMOS.

Variations on the Invention

It will be apparent to those of ordinary skill in the art that the invention may be embodied in various forms. For example, high-power $CO_2$ lasers may be used to generate an image having a substantially Gaussian intensity profile, which, in turn, is scanned across a surface of a substrate to effect rapid thermal processing, e.g., melt or non-melt processing, of the substrate surface. Such power levels may provide exposure energy doses of at least about 60 $J/cm^2$ over a 1 ms dwell time. Longer dwells require higher energies. The wavelength of the $CO_2$ laser, $\lambda$, is 10.6 μm in the infrared region, which is large relative to the typical dimensions of wafer features, and may therefore be uniformly absorbed as the beam scans across a patterned silicon wafer with the result that each point on the wafer is raised to very nearly the same maximum temperature.

In addition, the stage may include different components to carry out different functions. For example, an alignment system may be included to position the substrate on the stage at a variable orientation angle relative to the surface normal. In such a case, the substrate movement and alignment may be independently controlled.

Additional variations of the present invention will be apparent to those of ordinary skill in the art. Upon routine experimentation, those skilled in the art may find that the invention may be incorporated into existing equipment. Auxiliary subsystems known in the art may be used to stabilize the position and the width of the laser beam relative to the relay. Those of ordinary skill in the art will recognize that care must be taken to address certain operational issues relating to the practice of the invention using powerful lasers to realize the full benefit of the invention.

It is to be understood that, while the invention has been described in conjunction with the preferred specific embodiments thereof, the foregoing description is intended to illustrate and not limit the scope of the invention. Any aspects of the invention discussed herein may be included or excluded as appropriate. For example, beam combining technologies and beam shaping technologies may be used by themselves or in combination. Other aspects, advantages, and modifications within the scope of the invention will be apparent to those skilled in the art to which the invention pertains.

All patents and patent applications mentioned herein are hereby incorporated by reference in their entireties to an extent not inconsistent with the above disclosure.

What is claimed is:

1. A method for processing a surface of a substrate, comprising:
 (a) mounting the substrate on a moveable stage;
 (b) generating a photonic beam suitable for processing the substrate surface;
 (c) adjusting the moveable stage to position the substrate at a first orientation angle relative to the beam;
 (d) performing a first scanning of the beam translationally over the substrate surface along a first path at the first orientation angle relative to the beam; and
 (e) following step (d) adjusting the movable stage to position the substrate at a second orientation angle relative to the beam; and (f) following step (e), performing a second scanning of the beam translationally over the substrate surface along a second path at the second orientation angle relative to the beam.

2. The method of claim 1, wherein the photonic beam illuminates no more than 5% of the substrate surface at one time.

3. The method of claim 1, wherein the photonic beam is effective to heat an illuminated portion of the substrate surface at a rate of at least 1000° C. per second.

4. The method of claim 1, wherein steps (b) and (c) is carried out to allow the beam to scan translationally over substantially the entire substrate surface at first and second orientation angles.

5. The method of claim 1, wherein the first and second paths, when viewed from the first and second orientation angles, respectively, are substantially identical to each other.

6. The method of claim 5, wherein each of the first and second paths include a plurality of parallel segments.

7. The method of claim 6, wherein the parallel segments of each of the first and second paths are linear.

8. The method of claim 6, wherein the parallel segments of each of the first and second paths are curved.

9. The method of claim 6, wherein the parallel segments of the first and second paths on the substrate are spaced apart at a predetermined distance from each other so that the illuminated sections on the substrate along the parallel segments overlap.

10. The method of claim 9, wherein the beam has an intensity profile and predetermined distance is selected according to the intensity profile.

11. The method of claim 10, wherein the intensity profile has a peak intensity region and the predetermined distance is selected such that the peak intensity regions do not overlap.

12. The method of claim 1, wherein steps (d) and (f) are performed at substantially identical scan rates.

13. The method of claim 1, wherein one of steps (d) and (f) are carried out to allow the beam to scan translationally over substantially the entire substrate surface and the other of steps (d) and (f) is carried out to allow the beam to scan over only a selected portion of the substrate surface.

14. A method for processing a substrate to produce a desired substrate surface contour, comprising:
(a) mounting a substrate having a surface having an initial surface contour profile on a moveable stage;
(b) generating a photonic beam suitable for processing the substrate surface;
(c) adjusting the moveable stage to position the substrate at a first orientation angle relative to the beam;
(d) scanning the beam translationally over the substrate surface along a first path at the first orientation angle relative to the beam, thereby converting the initial surface contour of the substrate into intermediate surface contour;
(e) following step (d) adjusting the movable stage to position the substrate at a second orientation angle relative to the beam; and
(f) following step (e), performing a second scanning of the beam translationally over the substrate surface along a second path at the second orientation angle relative to the beam, thereby converting the intermediate surface contour into the desired surface contour.

15. A method for reshaping a substrate having a surface with a contour unsuitable for subsequent processing, comprising:
(a) mounting the substrate on a movable stage;
(b) generating a photonic beam suitable for thermally processing the substrate surface;
(c) adjusting the moveable stage to position the substrate at a selected orientation angle relative to the beam; and
(d) scanning the beam translationally over the substrate surface along a selected path and the selected orientation angle relative to the beam to reshape the surface of the substrate in a manner effective to convert the unsuitable surface contour into a contour suitable for subsequent processing.

16. A method for thermally processing a semiconductor substrate having a microelectronic circuit on a surface thereof, comprising:
(a) mounting the substrate on a movable stage;
(b) generating a photonic beam suitable for producing an elongate image suitable for thermally processing the substrate surface;
(c) adjusting the moveable stage to position the substrate at a selected orientation angle relative to the beam; and
(d) scanning the image translationally over the substrate surface at the selected orientation angle relative to the beam effective to produce a surface strain in a manner that enhances carrier mobility in the microelectronic circuit relative to carrier mobility of the circuit without the surface strain.

17. The method of claim 16, wherein the microelectronic circuit comprises a PMOS transistor.

18. The method of claim 16, wherein the microelectronic circuit comprises a NMOS transistor.

\* \* \* \* \*